(12) United States Patent
Wang et al.

(10) Patent No.: US 11,374,014 B2
(45) Date of Patent: Jun. 28, 2022

(54) FLASH WITH SHALLOW TRENCH IN CHANNEL REGION AND METHOD FOR MANUFACTURING THE SAME

(71) Applicant: Shanghai Huali Microelectronics Corporation, Shanghai (CN)

(72) Inventors: Chengcheng Wang, Shanghai (CN); Rong Zou, Shanghai (CN); Qiwei Wang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 122 days.

(21) Appl. No.: 16/854,129

(22) Filed: Apr. 21, 2020

(65) Prior Publication Data

US 2020/0402987 A1 Dec. 24, 2020

(30) Foreign Application Priority Data

Jun. 19, 2019 (CN) .......................... 201910530006.2

(51) Int. Cl.
*H01L 27/11524* (2017.01)
*H01L 27/11519* (2017.01)
(Continued)

(52) U.S. Cl.
CPC .. *H01L 27/11524* (2013.01); *H01L 27/11519* (2013.01); *H01L 29/66825* (2013.01); *H01L 29/788* (2013.01)

(58) Field of Classification Search
CPC ......... H01L 27/11524; H01L 27/11519; H01L 29/66825; H01L 29/788; H01L 27/11521;
(Continued)

(56) References Cited

U.S. PATENT DOCUMENTS 6,372,564 B1 * 4/2002 Lee ..................... H01L 27/115
438/192
7,626,230 B2 12/2009 Joo et al.
(Continued)

FOREIGN PATENT DOCUMENTS

CN 1484861 A 3/2004
CN 1959960 A 5/2007
(Continued)

OTHER PUBLICATIONS

Jan. 26, 2021—CN—CNIPA First Search Report Appn 201910530006.2.
Jun. 19, 2021—CN—CNIPA Second Search Report Appn 201910530006.2.

*Primary Examiner* — Duy T Nguyen
(74) *Attorney, Agent, or Firm* — Banner & Witcoff, Ltd.

(57) ABSTRACT

The present invention discloses a flash. A channel region comprises a first shallow trench formed in the surface area of a semiconductor substrate. A tunneling dielectric layer and a polysilicon floating gate are formed in the first shallow trench and extended to the outside of the first shallow trench. A control dielectric layer and a polysilicon control gate are sequentially formed on the two side surfaces in the width direction and the top surface of the polysilicon floating gate. A source region and a drain region are formed in a self-aligned manner in active regions on the two sides in the length direction of the polysilicon floating gate. The present invention further discloses a method for manufacturing a flash. The present invention can break through the limitation of the length of the channel on the size of the memory cell, thus reducing the area of the memory cell.

15 Claims, 6 Drawing Sheets

(51) Int. Cl.
*H01L 29/66* (2006.01)
*H01L 29/788* (2006.01)

(58) Field of Classification Search
CPC ........... H01L 29/40114; H01L 29/1037; H01L 29/7889
USPC ........................................................ 257/314
See application file for complete search history.

(56) References Cited

U.S. PATENT DOCUMENTS

| | | | |
|---|---|---|---|
| 2005/0020086 A1* | 1/2005 | Kim | H01L 29/66621 257/E29.267 |
| 2005/0074949 A1* | 4/2005 | Jung | H01L 27/11521 438/424 |
| 2005/0265079 A1* | 12/2005 | Shirota | G11C 16/0483 365/185.21 |
| 2011/0014758 A1 | 1/2011 | Joo et al. | |
| 2015/0021679 A1* | 1/2015 | Tsair | H01L 29/7881 438/266 |
| 2017/0033116 A1* | 2/2017 | Wang | H01L 29/66348 |

FOREIGN PATENT DOCUMENTS

| | | | |
|---|---|---|---|
| CN | 1992352 | A | 7/2007 |
| CN | 104979354 | A | 10/2015 |
| CN | 204885163 | U | 12/2015 |
| CN | 206774545 | U | 12/2017 |

* cited by examiner

FLASH WITH SHALLOW TRENCH IN CHANNEL REGION AND METHOD FOR MANUFACTURING THE SAME

CROSS REFERENCE TO RELATED APPLICATIONS

The present application claims priority to and the benefit of Chinese Patent Application No. 201910530006.2 filed on Jun. 19, 2019, the disclosure of which is incorporated herein by reference in its entirety as part of the present application.

BACKGROUND

The present invention relates to the field of semiconductor integrated circuits, in particular to a flash. The present invention further relates to a method for manufacturing a flash.

In the past 20 years, the size reduction of stackable memory was realized by the upgrade of photolithography process and the innovation of architecture. However, in NOR flashes, nodes less than 45 nm have been limited by the length of the channel rather than the photolithography process. Short channel effect will lead to channel leakage, which causes the problems such as read current leakage and poor hot electron programming distribution. In a word, the length of the channel of the flash unit of the NOR flash is limited to more than 100 nm. For example, in the NOR flash with the existing Erase Through Oxide (ETOX) architecture, technologies of nodes more than 45 nm have always been limited to the planar technology with the minimum memory cell area close to $10F^2$. The minimum channel length is not less than 110 nm. F represents one feature size. For 45 nm nodes, one feature size is 45 nm.

As illustrated in FIG. 1A, it is a view of an array structure of an existing flash. FIG. 1B is a view of a cross-sectional structure of the existing flash along line AA in FIG. 1A. The existing flash comprises a plurality of memory cells, which are as illustrated by a dashed line frame 104 on the top view plane. Each memory cell comprises a gate structure, a source region 208, a drain region 209 and a channel region.

A control dielectric layer 204 and a polysilicon control gate 205 are sequentially formed on the two side surfaces in the width direction and top surface of the polysilicon floating gate 203. At present, the gate structure of each memory cell is formed by superposing the tunneling dielectric layer 202 formed on the surface of the semiconductor substrate 201, the polysilicon floating gate 203, the control dielectric layer 204 and the polysilicon control gate 205. Generally, the semiconductor substrate 201 is a silicon substrate. The tunneling dielectric layer 202 is an oxide layer. The control dielectric layer 204 is a superposed layer of an oxide layer, a nitride layer and an oxide layer.

The source region 208 and the drain region 209 are formed in a self-aligned manner in active regions 101 on the two sides of the gate structure.

Generally, side walls 206 are further formed on the side surfaces of the gate structure. The drain region 209 consists of a heavily doped region such as N+ region. The side of the drain region 209 close to the gate structure further comprises a lightly doped drain region 207. The lightly doped drain region 207 and the side surface of the gate structure are self-aligned. The drain region 209 is formed by adopting N+ ion implantation after the side walls 206 are formed.

The channel region is located in the surface area of the semiconductor substrate 201 covered by the polysilicon floating gate 203 between the source region 208 and the drain region 209. The surface of the channel region covered by the polysilicon floating gate 203 is used to form a channel connecting the source region 208 and the drain region 209.

In FIG. 1A, the memory cells are arranged in rows and columns to form an array structure of the flash, and the flash is in an NOR structure.

The polysilicon control gates 205 of the memory cells in the same row are connected together to form a polysilicon row 102. The polysilicon row 102 forms a word line (WL).

The drain regions 209 of the memory cell in the same column are connected to a bit line (BL) composed of a front metal layer through corresponding contact holes 103.

The source regions 208, the drain regions 209 and the channel regions of the memory cells in the same column are located in the active regions 101 in the same column structure, and the overlapping area of the active regions 101 and the corresponding polysilicon row 102 is the forming area of the polysilicon floating gate 203.

In the array structure, the source regions 208 in the same row are connected together and are in a self-aligned source (SAS) structure.

The active regions 101 in each column are isolated by a shallow trench field oxide. The shallow trench field oxide is formed in the shallow trench.

In the existing flash, the size of a memory cell is as illustrated in the dashed line frame 104, wherein the width of the memory cell is L101, the length is L102, the width L101 may reach 2F, and F represents one feature size. The length L102 is limited by the length of the channel. That is to say, although the photolithography process is capable of enabling the length L102 to be smaller, it will also cause the length of the channel to be decreased, so that the short channel effect of the device is increased and problems related to the short channel effect such as channel leakage are caused, which further cause problems such as reading current leakage and poor hot electron programming distribution.

Taking the technical node less than 45 nm as an example, the feature size is 45 nm, and the length of the channel satisfying the short channel effect is more than 100 nm, for example, not less than 110 nm. Therefore, the length L102 is required to be more than 5F, so that the minimum area of the memory cell can only reach $10F^2$.

BRIEF SUMMARY

The technical problem to be solved by the present invention is to provide a flash, which can break through the limitation of the length of the channel on the size of the memory cell, thus reducing the area of the memory cell. For this purpose, the present invention further provides a method for manufacturing a flash.

In order to solve the above technical problem, the flash provided by the present invention comprises a plurality of memory cells; each memory cell comprises a gate structure, a source region, a drain region and a channel region.

The channel region comprises a first shallow trench formed in the surface area of a semiconductor substrate, a tunneling dielectric layer is formed on the bottom surface and the side surfaces of the first shallow trench, the tunneling dielectric layer is further extended to the surface of the semiconductor substrate outside the first shallow trench, and the polysilicon floating gate fully fills the first shallow trench formed with the tunneling dielectric layer and is extended to the surface of the tunneling dielectric layer outside the first shallow trench.

A control dielectric layer and a polysilicon control gate are sequentially formed on the two side surfaces in the width direction and the top surface of the polysilicon floating gate; the gate structure of each memory cell is formed by superposing the corresponding tunneling dielectric layer, the polysilicon floating gate, the control dielectric layer and the polysilicon control gate.

The source region and the drain region are formed in a self-aligned manner in active regions on the two sides in the length direction of the polysilicon floating gate, and the two side surfaces in the width direction of the polysilicon floating gate and the two side surfaces in the width direction of the active region are self-aligned.

The channel region is located in the surface area of the semiconductor substrate covered by the polysilicon floating gate between the source region and the drain region; the surface of the channel region covered by the polysilicon floating gate is used to form a channel connecting the source region and the drain region, the channel is provided with a longitudinal structure extending along the side surface of the first shallow trench, and the longitudinal structure of the channel enables the length of the channel to be increased and enables the length of the polysilicon floating gate to be decreased under the condition that the length of the channel satisfies a short channel effect, thus reducing the area of the memory cell.

As a further improvement, the semiconductor substrate is a silicon substrate.

As a further improvement, the tunneling dielectric layer is an oxide layer and the control dielectric layer is a superposed layer of an oxide layer, a nitride layer and an oxide layer.

As a further improvement, the memory cells are arranged in rows and columns to form an array structure of the flash, and the flash is in an NOR structure.

The polysilicon control gates of the memory cells in the same row are connected together to form a polysilicon row.

The drain regions of each of the memory cells in the same column are connected to a bit line composed of a front metal layer through corresponding contact holes.

The source regions, the drain regions and the channel regions of the memory cells in the same column are located in the active regions of the same column structure, and the overlapping area of the active region and the corresponding polysilicon row is the forming area of the polysilicon floating gate.

The active regions in each column are isolated by a shallow trench field oxide, and the shallow trench field oxide is formed in a second shallow trench.

As a further improvement, the length of the polysilicon floating gate is less than two feature sizes.

As a further improvement, the area of the memory cell is less than $6F^2$ and F represents one feature size.

As a further improvement, the feature size is less than 45 nm and the length of the channel satisfying the short channel effect is more than 100 nm.

In order to solve the above technical problem, in the method for manufacturing the flash provided by the present invention, the flash comprises a plurality of memory cells, and the steps of forming the memory cells comprise:

step 1: providing a semiconductor substrate and forming a first shallow trench in the surface area of the semiconductor substrate in the forming area of a channel region;

step 2: forming a hard mask layer, the hard mask layer fully filling the first shallow trench and covering the surface of the semiconductor substrate outside the first shallow trench;

step 3: using a photolithography process to define the formation area of the second shallow trench, and the hard mask layer and the first semiconductor substrate are sequentially etched to form the second shallow trench according to the photolithographic definition;

step 4: filling a shallow trench field oxide into the second shallow trench, and performing flattening to enable the surface of the shallow trench field oxide to be in flush with the surface of the hard mask layer, the shallow trench field oxide defining an active region;

step 5: removing the hard mask layer in a self-aligned manner by using the shallow trench field oxide as a mask, and sequentially forming a tunneling dielectric layer and a polysilicon floating gate in the removed area of the hard mask layer, the two side surfaces in the width direction of the polysilicon floating gate and the two side surfaces in the width direction of the active region being self-aligned;

step 6: etching back the shallow trench field oxide in a self-aligned manner by using the polysilicon floating gate as a mask, and etching back the surface of the shallow trench field oxide to be in flush with the surface of the semiconductor substrate;

step 7: forming a control dielectric layer, the control dielectric layer covering the top surface and side surfaces of the polysilicon floating gate;

step 8: forming a polysilicon control gate on the surface of the control dielectric layer;

step 9: using a photolithography process to define the formation area of a gate structure, and sequentially etching the polysilicon control gate, the control dielectric layer and the polysilicon floating gate according to the photolithographic definition to form the gate structure, the side surfaces of the polysilicon floating gate formed by etching being the two side surfaces in the length direction; the gate structure of each memory cell being formed by superposing the corresponding tunneling dielectric layer, the polysilicon floating gate, the control dielectric layer and the polysilicon control gate;

step 10: forming a source region and a drain region in a self-aligned manner in the active regions on the two sides in the length direction of the polysilicon floating gate of the gate structure.

The channel region is located in the surface area of the semiconductor substrate covered by the polysilicon floating gate between the source region and the drain region; the surface of the channel region covered by the polysilicon floating gate is used to form a channel connecting the source region and the drain region, the channel is provided with a longitudinal structure extending along the side surface of the first shallow trench, and the longitudinal structure of the channel enables the length of the channel to be increased and enables the length of the polysilicon floating gate to be decreased under the condition that the length of the channel satisfies a short channel effect, thus reducing the area of the memory cell.

As a further improvement, the semiconductor substrate is a silicon substrate.

As a further improvement, the tunneling dielectric layer is an oxide layer and the control dielectric layer is a superposed layer of an oxide layer, a nitride layer and an oxide layer.

As a further improvement, the hard mask layer is a nitride layer or the hard mask layer is a superposed layer of an oxide layer and a nitride layer.

As a further improvement, the memory cells are arranged in rows and columns to form an array structure of the flash, and the flash is in an NOR structure.

The polysilicon control gates of the memory cells in the same row are connected together to form a polysilicon row; the polysilicon row is defined through the photolithography process in step 9.

The drain regions of each of the memory cells in the same column are connected to a bit line composed of a front metal layer through corresponding contact holes;

The source regions, the drain regions and the channel regions of the memory cells in the same column are located in the active regions of the same column structure, and the overlapping area of the active region and the corresponding polysilicon row is the forming area of the polysilicon floating gate; the active regions in each column are isolated by the shallow trench field oxide.

As a further improvement, the length of the polysilicon floating gate is less than two feature sizes.

As a further improvement, the area of the memory cell is less than $6F^2$ and F represents one feature size.

As a further improvement, the feature size is less than 45 nm and the length of the channel satisfying the short channel effect is more than 100 nm.

In the present invention, by arranging the first shallow trench in the channel region of the memory cell of the flash, the tunneling dielectric layer is formed on the bottom surface and side surfaces of the first shallow trench and the polysilicon floating gate fully fills the first shallow trench. Since the channel for connecting the source region and the drain region is formed on the surface of the channel region covered by the polysilicon floating gate, the channel is provided with the longitudinal structure extending along the side surface of the first shallow trench. In the present invention, the arrangement of the first shallow trench can enable the length of the channel to be increased to the requirement of enabling the length of the channel to satisfy the short channel effect and can enable the length of the polysilicon floating gate to be decreased under the condition that the length of the channel satisfies the short channel effect, so as to break through the limitation of the length of the channel on the size of the memory cell, thus reducing the area of the memory cell.

BRIEF DESCRIPTION OF THE DRAWINGS

The present invention will be further described below in detail with reference to the drawings in combination with the specific embodiments.

DETAILED DESCRIPTION

Figure 1A:
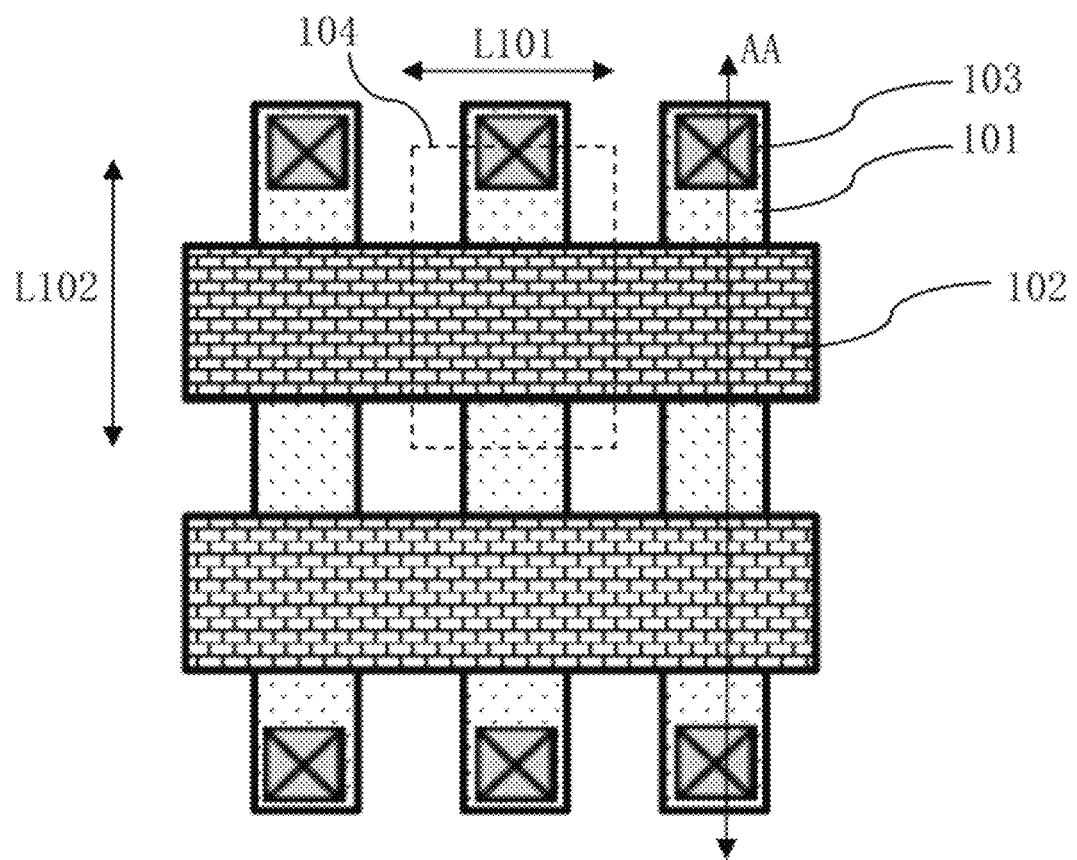
FIG. 1A is a view of an array structure of an existing flash.
Figure 1B:
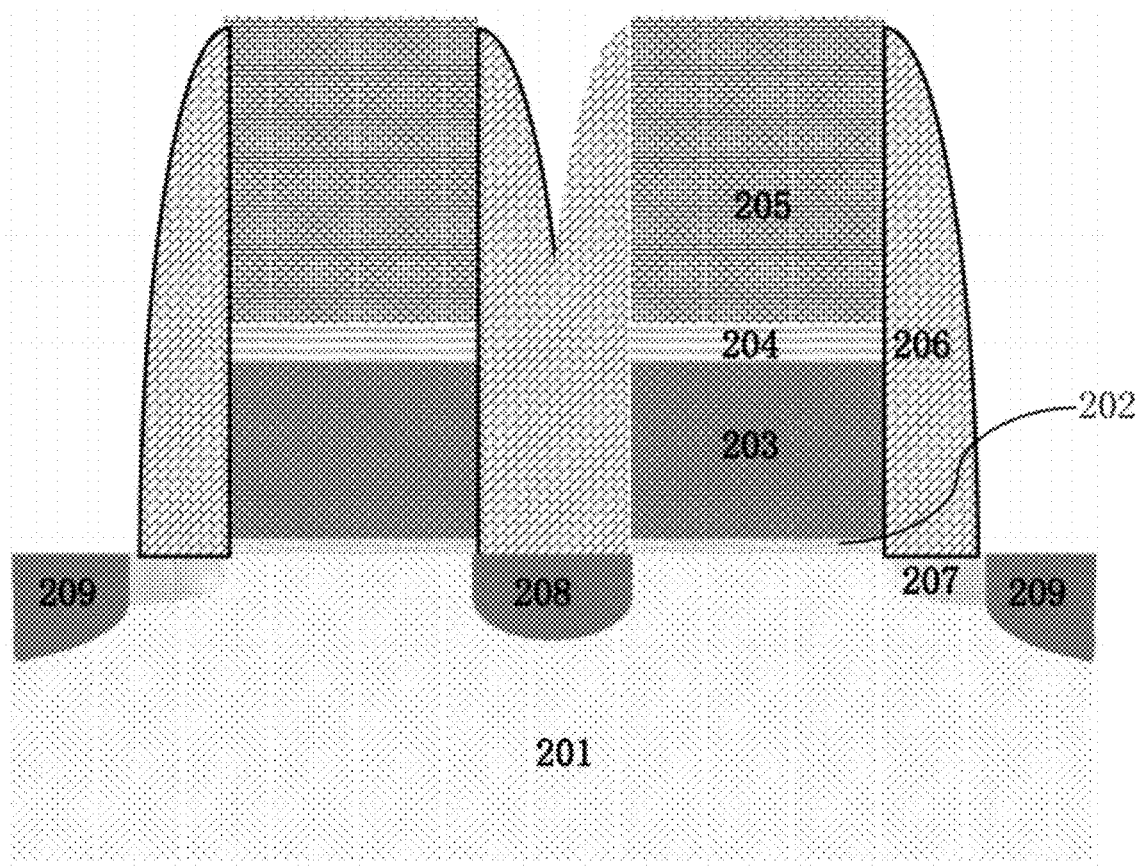
FIG. 1B is a view of a cross-sectional structure of the existing flash along line AA in FIG. 1A.
Figure 2A:
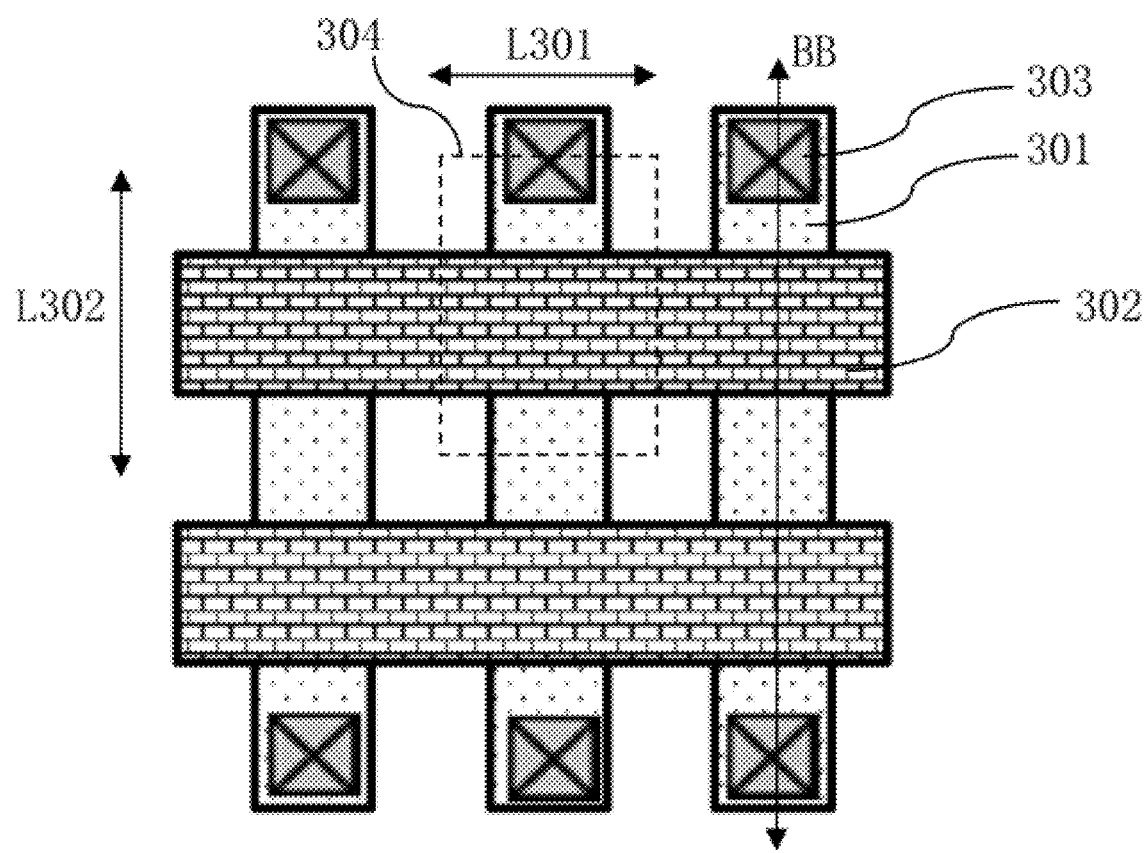
FIG. 2A is a view of an array structure of a flash according to one embodiment of the present invention.
Figure 2B:
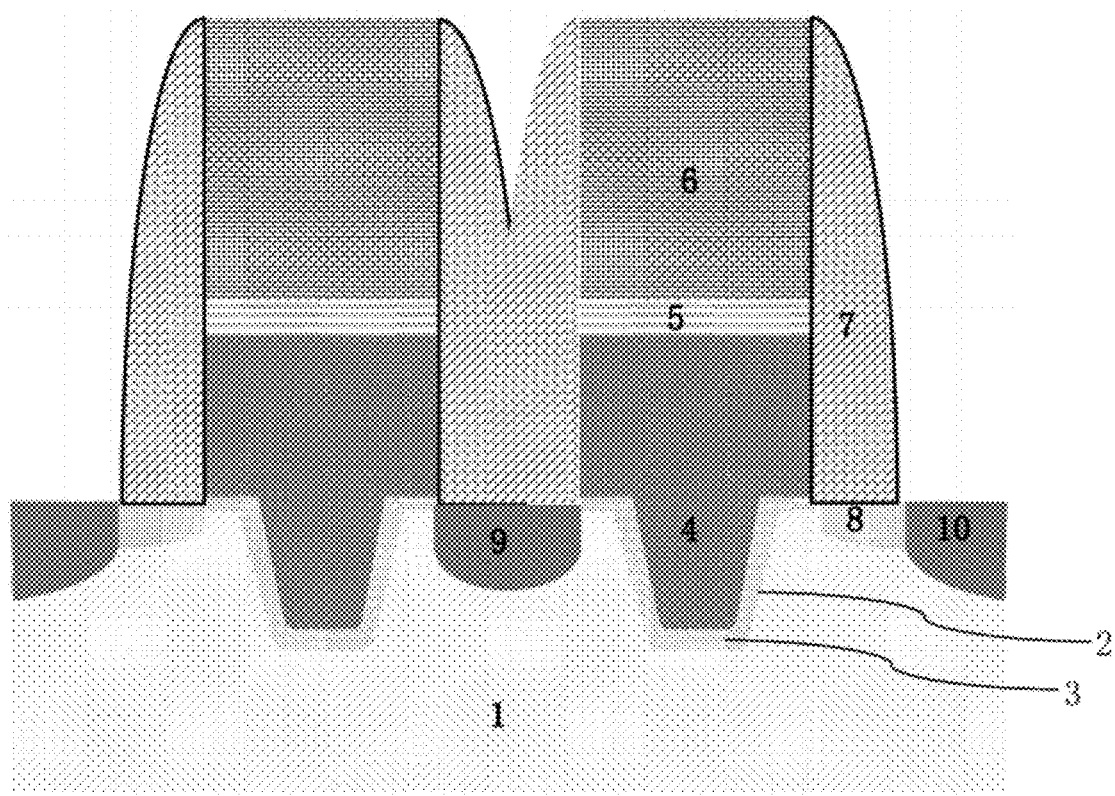
FIG. 2B is a view of a cross-sectional structure of the flash according to one embodiment of the present invention along line BB in FIG. 2A.

FIG. 2A is a view of an array structure of a flash according to one embodiment of the present invention. FIG. 2B is a view of a cross-sectional structure of the flash according to one embodiment of the present invention along line BB in FIG. 2A. The flash according to the embodiment of the present invention comprises a plurality of memory cells. The memory cell in a top view is as illustrated in a dashed line frame 304. Each memory cell comprises a gate structure, a source region 9, a drain region 10 and a channel region.

The channel region comprises a first shallow trench 2 formed in the surface area of a semiconductor substrate 1. In the embodiment of the present invention, the semiconductor substrate 1 is a silicon substrate.

A tunneling dielectric layer 3 is formed on the bottom surface and the side surfaces of the first shallow trench 2. The tunneling dielectric layer 3 is further extended to the surface of the semiconductor substrate 1 outside the first shallow trench 2. In the embodiment of the present invention, the tunneling dielectric layer 3 is an oxide layer.

The polysilicon floating gate 4 fully fills the first shallow trench 2 formed with the tunneling dielectric layer 3 and is extended to the surface of the tunneling dielectric layer 3 outside the first shallow trench 2.

A control dielectric layer 5 and a polysilicon control gate 6 are sequentially formed on the two side surfaces in the width direction and the top surface of the polysilicon floating gate 4. In the embodiment of the present invention, the control dielectric layer 5 is a superposed layer of an oxide layer, a nitride layer and an oxide layer.

The gate structure of each memory cell is formed by superposing the corresponding tunneling dielectric layer 3, the polysilicon floating gate 4, the control dielectric layer 5 and the polysilicon control gate 6.

The source region 9 and the drain region 10 are formed in a self-aligned manner in active regions 301 on the two sides in the length direction of the polysilicon floating gate 4, and the two side surfaces in the width direction of the polysilicon floating gate 4 and the two side surfaces in the width direction of the active region 301 are self-aligned.

Generally, side walls 7 are further formed on the side surfaces of the gate structure. The drain region 10 consists of a heavily doped region such as N+ region. The side of the drain region 10 close to the gate structure further comprises a lightly doped drain region 8. The lightly doped drain region 8 and the side surface of the gate structure are self-aligned. The drain region 10 is formed by adopting N+ ion implantation after the side walls 7 are formed.

The channel region is located in the surface area of the semiconductor substrate 1 covered by the polysilicon floating gate 4 between the source region 9 and the drain region 10; the surface of the channel region covered by the polysilicon floating gate 4 is used to form a channel connecting the source region 9 and the drain region 10, the channel is provided with a longitudinal structure extending along the side surface of the first shallow trench 2, and the longitudinal structure of the channel enables the length of the channel to be increased and enables the length of the polysilicon floating gate 4 to be decreased under the condition that the length of the channel satisfies a short channel effect, thus reducing the area of the memory cell.

The memory cells are arranged in rows and columns to form an array structure of the flash, and the flash is in an NOR structure.

The polysilicon control gates 6 of the memory cells in the same row are connected together to form a polysilicon row 302. The polysilicon row 302 forms a word line.

The drain regions 10 of the memory cells in the same column are connected to a bit line composed of a front metal layer through corresponding contact holes 303.

The source regions 9, the drain regions 10 and the channel regions of the memory cells in the same column are located in the active regions of the same column structure, and the overlapping area of the active region 301 and the corresponding polysilicon row 302 is the forming area of the polysilicon floating gate 4.

In the array structure, the source regions 9 in the same row are connected together to form a self-aligned source structure.

The active regions 301 in each column are isolated by a shallow trench field oxide 403, and the shallow trench field oxide 403 is formed in a second shallow trench 402. For the structures of the second shallow trench 402 and the shallow trench field oxide 403, please refer to FIG. 3E.

The length of the polysilicon floating gate 4 is less than two feature sizes. The area of the memory cell is less than $6F^2$ and F represents one feature size. As illustrated in FIG. 2A, in the memory cell illustrated in a dashed line frame 304, the width of the memory cell is L301 and the length is L302. The width L301 can reach 2F and the length L302 can reach 3F, so that the area of the memory cell can reach less than $6F^2$.

Taking the technical node less than 45 nm as an example, the feature size in the embodiment of the present invention is less than 45 nm, and the length of the channel satisfying the short channel effect is more than 100 nm. Since the structural arrangement of the first shallow trench 2 is adopted in the embodiment of the present invention, the length of the polysilicon floating gate 4 in the embodiment of the present invention can be less than 100 nm. That is to say, the embodiment of the present invention can break through the limitation of the length of the channel on the length of the polysilicon floating gate 4 and can break through the limitation on the size of the memory cell, thus reducing the area of the memory cell.

In the embodiment of the present invention, by arranging the first shallow trench 2 in the channel region of the memory cell of the flash, the tunneling dielectric layer 3 is formed on the bottom surface and side surfaces of the first shallow trench 2 and the polysilicon floating gate 4 fully fills the first shallow trench 2. Since the channel for connecting the source region 9 and the drain region 10 is formed on the surface of the channel region covered by the polysilicon floating gate 4, the channel is provided with the longitudinal structure extending along the side surface of the first shallow trench 2. In the embodiment of the present invention, the arrangement of the first shallow trench 2 can enable the length of the channel to be increased to the requirement of enabling the length of the channel to satisfy the short channel effect and can enable the length of the polysilicon floating gate 4 to be decreased under the condition that the length of the channel satisfies the short channel effect, so as to break through the limitation of the length of the channel on the size of the memory cell, thus reducing the area of the memory cell.

Figure 3A:
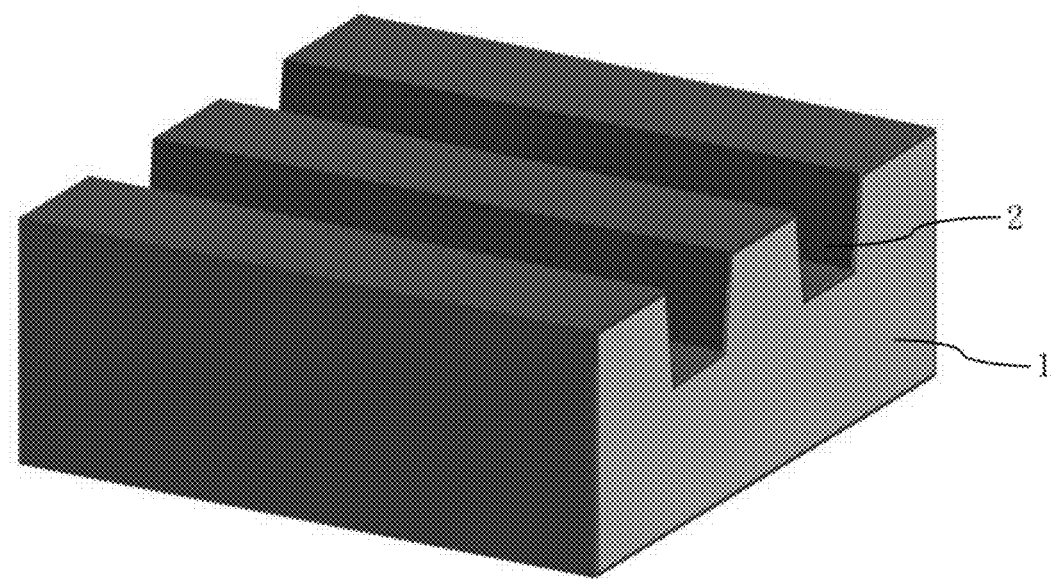
FIG. 3A to FIG. 3E are views of stereoscopic structures of devices in each step in a method for manufacturing a flash according to one embodiment of the present invention.

FIG. 3A to FIG. 3E are views of stereoscopic structures of devices in each step of a method for manufacturing a flash according to one embodiment of the present invention. In the method for manufacturing the flash according to the embodiment of the present invention, the flash comprises a plurality of memory cells, the memory cells are arranged in rows and columns to form an array structure of the flash, and the flash is in an NOR structure. For the array structure of the flash, please refer to FIG. 2A. For the cross-sectional structure of the memory cell, please refer to FIG. 2B. The steps of forming the memory cells comprise the following steps:

In step 1, as illustrated in FIG. 3A, a semiconductor substrate 1 is provided and a first shallow trench 2 is formed in the surface area of the semiconductor substrate 1 in the forming area of a channel region.

The semiconductor substrate 1 is a silicon substrate.

Figure 3B:
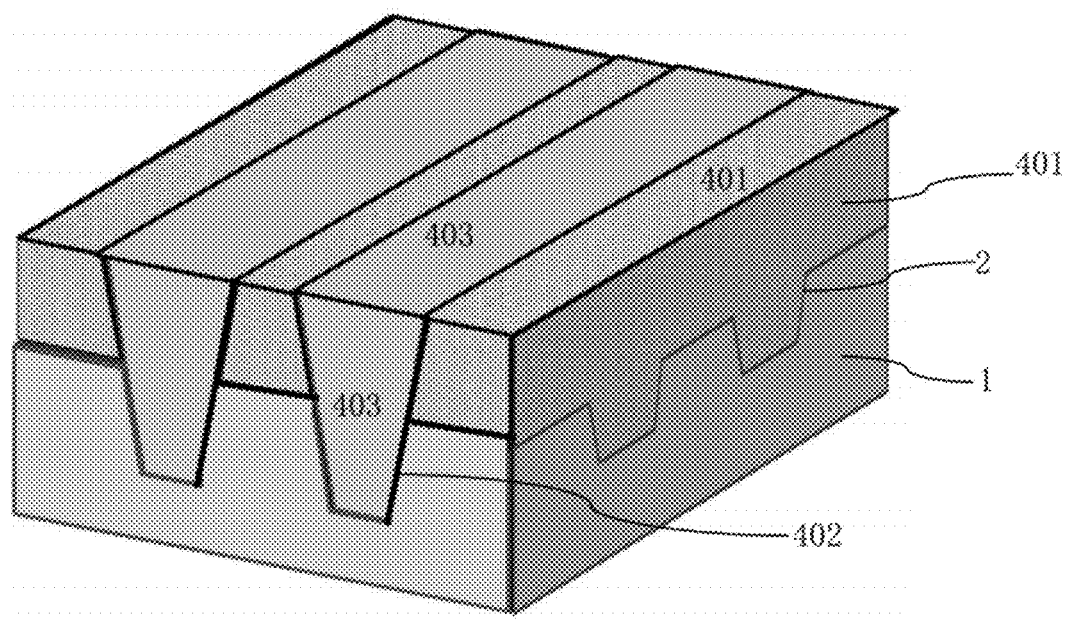

In step 2, as illustrated in FIG. 3B, a hard mask layer 401 is formed. The hard mask layer 401 fully fills the first shallow trench 2 and covers the surface of the semiconductor substrate 1 outside the first shallow trench 2.

The hard mask layer 401 is a nitride layer or the hard mask layer 401 is a superposed layer of an oxide layer and a nitride layer.

In step 3, as illustrated in FIG. 3B, using a photolithography process to define the formation area of the second shallow trench 402, and the hard mask layer 401 and the first semiconductor substrate 1 are sequentially etched to form the second shallow trench 402 according to the photolithographic definition.

In step 4, as illustrated in FIG. 3B, a shallow trench field oxide 403 is filled into the second shallow trench 402, and flattening is performed to enable the surface of the shallow trench field oxide 403 to be in flush with the surface of the hard mask layer 401. The shallow trench field oxide 403 defines an active region 301.

Figure 3C:
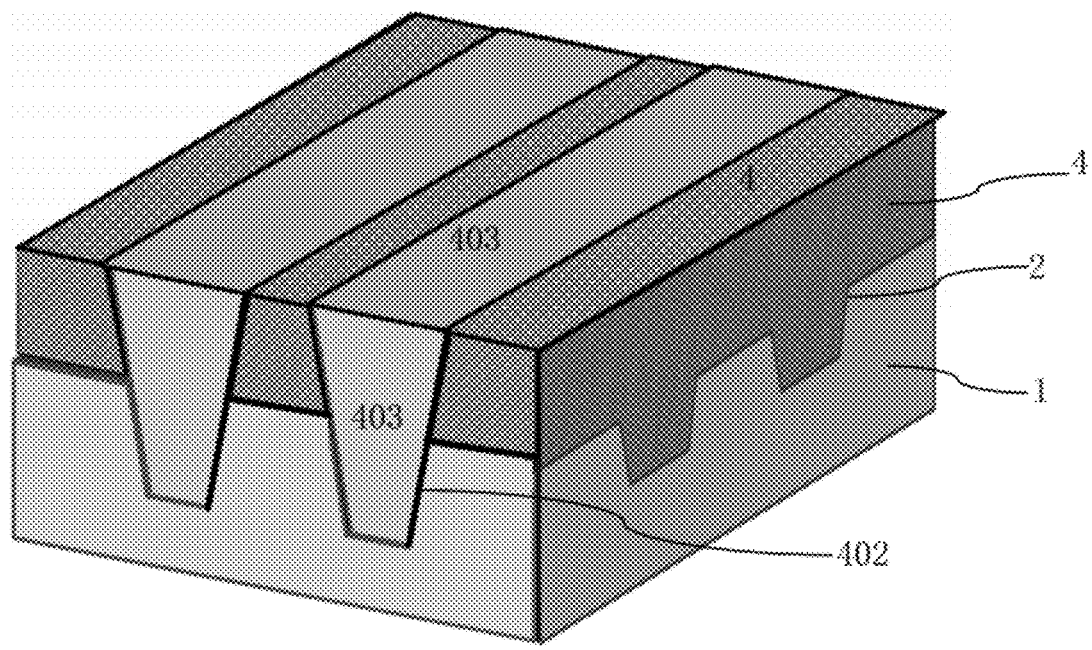

In step 5, as illustrated in FIG. 3C, the hard mask layer 401 is removed in a self-aligned manner by using the shallow trench field oxide 403 as a mask, and a tunneling dielectric layer 3 and a polysilicon floating gate 4 are sequentially formed in the removed area of the hard mask layer 401. The two side surfaces in the width direction of the polysilicon floating gate 4 and the two side surfaces in the width direction of the active region 301 are self-aligned.

The tunneling dielectric layer 3 is an oxide layer.

Figure 3D:
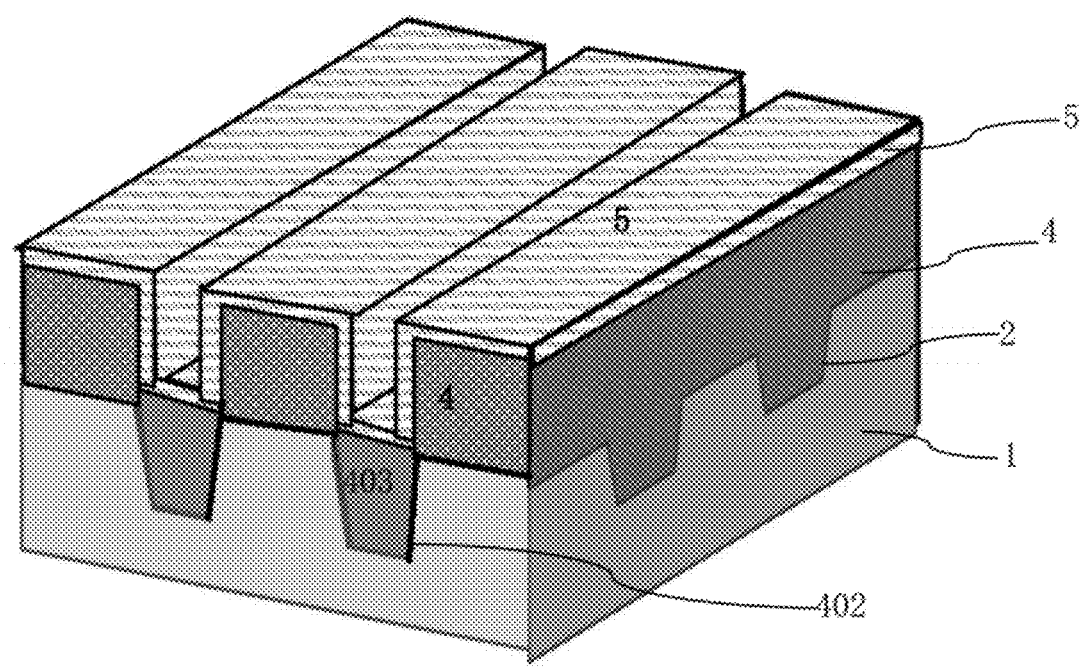

In step 6, as illustrated in FIG. 3D, the shallow trench field oxide 403 is etched back in a self-aligned manner by using the polysilicon floating gate 4 as a mask, and the surface of the shallow trench field oxide 403 is etched back to be in flush with the surface of the semiconductor substrate 1.

In step 7, as illustrated in FIG. 3D, a control dielectric layer 5 is formed. The control dielectric layer 5 covers the top surface and side surfaces of the polysilicon floating gate 4.

The control dielectric layer 5 is a superposed layer of an oxide layer, a nitride layer and an oxide layer.

Figure 3E:
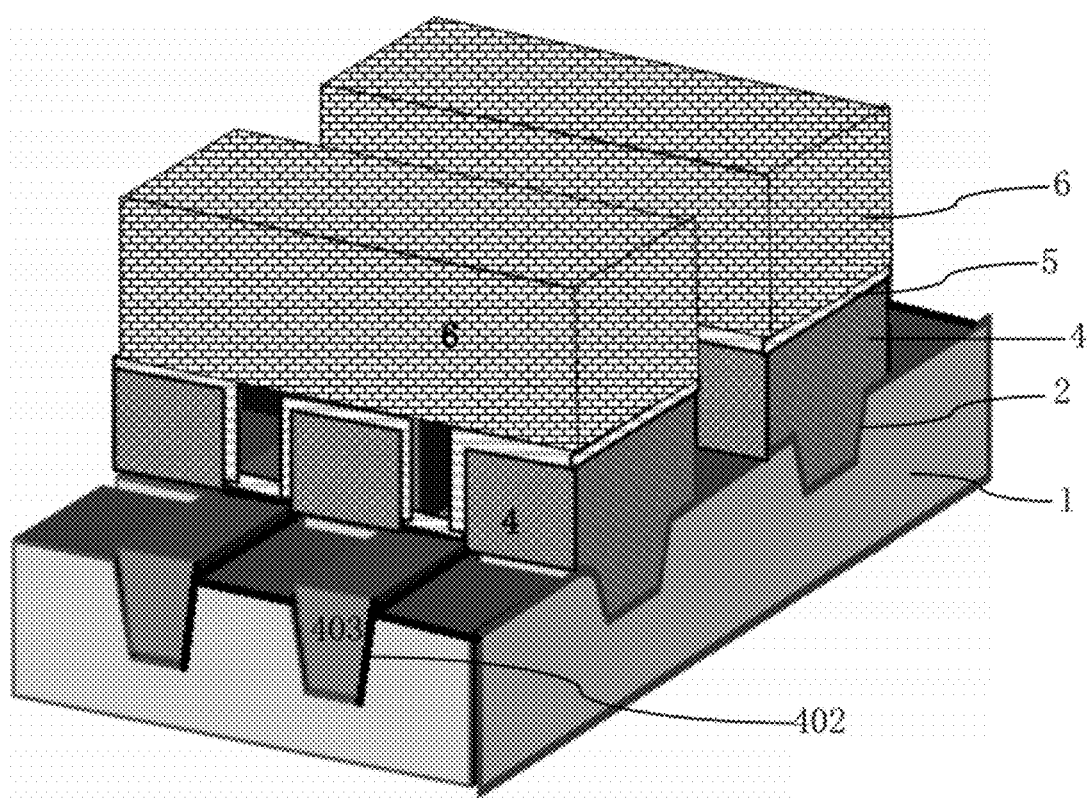

In step 8, as illustrated in FIG. 3E, a polysilicon control gate 6 is formed on the surface of the control dielectric layer 5.

In step 9, using a photolithography process to define the formation area of a gate structure, and the polysilicon control gate 6, the control dielectric layer 5 and the polysilicon floating gate 4 are sequentially etched according to photolithographic definition to form the gate structure. The side surfaces of the polysilicon floating gate 4 formed by etching are the two side surfaces in the length direction. It can be seen that the control dielectric layer 5 and the polysilicon control gate 6 covered on the two sides in the width direction of the polysilicon floating gate 4 are reserved. The gate structure of each memory cell is formed by superposing the corresponding tunneling dielectric layer 3, the polysilicon floating gate 4, the control dielectric layer 5 and the polysilicon control gate 6.

In step 10, a source region 9 and a drain region 10 are formed in a self-aligned manner in the active regions 301 on the two sides in the length direction of the polysilicon floating gate 4 of the gate structure. Generally, side walls 7 are further formed on the side surfaces of the gate structure. The drain region 10 consists of a heavily doped region such as N+ region. The side of the drain region 10 close to the gate structure further comprises a lightly doped drain region 8. The lightly doped drain region 8 and the side surface of the gate structure are self-aligned. The drain region 10 is formed by adopting N+ ion implantation after the side walls 7 are formed.

The channel region is located in the surface area of the semiconductor substrate 1 covered by the polysilicon floating gate 4 between the source region 9 and the drain region 10; the surface of the channel region covered by the polysilicon floating gate 4 is used to form a channel connecting the source region 9 and the drain region 10, the channel is provided with a longitudinal structure extending along the side surface of the first shallow trench 2, and the longitudinal structure of the channel enables the length of the channel to be increased and enables the length of the polysilicon floating gate 4 to be decreased under the condition that the length of the channel satisfies a short channel effect, thus reducing the area of the memory cell.

In the method according to the embodiment of the present invention, the polysilicon control gates 6 of the memory cells in the same row are connected together to form a polysilicon row 302. The polysilicon row 302 is defined through the photolithography process in step 9.

The drain regions 10 of each of the memory cells in the same column are connected to a bit line composed of a front metal layer through corresponding contact holes 303.

The source regions 9, the drain regions 10 and the channel regions of the memory cells in the same column are located in the active regions 301 of the same column structure, and the overlapping area of the active region 301 and the corresponding polysilicon row 302 is the forming area of the polysilicon floating gate 4. The active regions 301 in each column are isolated by the shallow trench field oxide 403.

From the array structure illustrated in FIG. 2A, it can be seen that, in the method according to the embodiment of the present invention, each first shallow trench2 formed in step 1 is a row structure, and the first shallow trench 2 is perpendicular to the corresponding second shallow trench 402, so that after the second shallow trench 402 is formed, the width side of the active region 301 and the side surface in the width direction of the polysilicon floating gate 4 can be defined at the same time; in addition, since the overlapping area of the polysilicon row 302 and the active region 301 is the forming area of the polysilicon floating gate 4 which finally forms the gate structure, the polysilicon row 302 defined in step 9 covers a position above the first shallow trench 2 and the two side surfaces of the polysilicon row 302 are located outside the two side surfaces of the first shallow trench 2, so that the two side surfaces in the length direction of the polysilicon floating gate 4 formed after etching are in flush with the side surfaces of the polysilicon row 302, and the polysilicon floating gate 4 is extended to the outer side surface of the first shallow trench 2.

The length of the polysilicon floating gate 4 is less than two feature sizes. The area of the memory cell is less than $6F^2$ and F represents one feature size. As illustrated in FIG. 2A, in the memory cell illustrated in a dashed line frame 304, the width of the memory cell is L301 and the length is L302. The width L301 can reach 2F and the length L302 can reach 3F, so that the area of the memory cell can reach less than $6F^2$.

Taking the technical node less than 45 nm as an example, the feature size in the embodiment of the present invention is less than 45 nm, and the length of the channel satisfying the short channel effect is more than 100 nm. Since the structural arrangement of the first shallow trench 2 is adopted in the embodiment of the present invention, the length of the polysilicon floating gate 4 in the embodiment of the present invention can be less than 100 nm. That is to say, the embodiment of the present invention can break through the limitation of the length of the channel on the length of the polysilicon floating gate 4 and can break through the limitation on the size of the memory cell, thus reducing the area of the memory cell.

The present invention has been described above in detail through specific embodiments, but these embodiments do not constitute limitations to the present invention. Without departing from the principle of the present invention, one skilled in the art may also make many variations and improvements, which should also be regarded as included in the protection scope of the present invention.

What is claimed is:

1. A flash, wherein the flash comprises a plurality of memory cells; each memory cell comprises a gate structure, a source region, a drain region, and a channel region;

the channel region comprises a first shallow trench formed in a surface area of a semiconductor substrate, a tunneling dielectric layer is formed on a bottom surface and side surfaces of the first shallow trench, the tunneling dielectric layer is further extended to a surface of the semiconductor substrate outside of the first shallow trench, and a polysilicon floating gate fully fills the first shallow trench formed with the tunneling dielectric layer and is extended to a surface of the tunneling dielectric layer outside of the first shallow trench, a top surface of the polysilicon floating gate is a flat surface and higher than a top surface of the first shallow trench;

a control dielectric layer and a polysilicon control gate are sequentially formed on two side surfaces in a width direction and a top surface of the polysilicon floating gate; the gate structure is formed by superposing a corresponding tunneling dielectric layer, the polysilicon floating gate, the control dielectric layer, and the polysilicon control gate;

the source region and the drain region are formed in a self-aligned manner in active regions on two sides in a length direction of the polysilicon floating gate, and the two side surfaces in the width direction of the polysilicon floating gate and two side surfaces in the width direction of the active region are self-aligned; and the channel region is located in a surface area of the semiconductor substrate covered by the polysilicon floating gate between the source region and the drain region; and a surface of the channel region covered by the polysilicon floating gate is used to form a channel connecting the source region and the drain region, the channel is provided with a longitudinal structure extending along the side surface of the first shallow trench, the channel also includes a transverse structure located on the bottom surface of the first shallow trench and the surface of the semiconductor substrate outside of the first shallow trench, and the longitudinal structure of the channel enables a length of the channel to be increased and enables a length of the polysilicon floating gate to be decreased under a condition that the length of the channel satisfies a short channel effect, thus reducing an area of the memory cell.

2. The flash according to claim 1, wherein the semiconductor substrate is a silicon substrate.

3. The flash according to claim 2, wherein the tunneling dielectric layer is an oxide layer and the control dielectric layer is a superposed layer of an oxide layer, a nitride layer, and an oxide layer.

4. The flash according to claim 3, wherein the memory cells are arranged in rows and columns to form an array structure of the flash, and the flash is in an NOR structure;
   polysilicon control gates of the memory cells in a same row are connected together to form a polysilicon row;
   drain regions of each of the memory cells in a same column are connected to a bit line composed of a front metal layer through corresponding contact holes;
   source regions, drain regions, and channel regions of the memory cells in the same column are located in active regions of a same column structure, and an overlapping area of the active region and a corresponding polysilicon row is a forming area of the polysilicon floating gate; and
   active regions in each column are isolated by a shallow trench field oxide, and the shallow trench field oxide is formed in a second shallow trench.

5. The flash according to claim 4, wherein the length of the polysilicon floating gate is less than two feature sizes, wherein the feature size is a size representing a technical node.

6. The flash according to claim 5, wherein the area of the memory cell is less than $6F^2$ and F represents one feature size.

7. The flash according to claim 6, wherein the feature size is less than 45 nm and the length of the channel satisfying the short channel effect is more than 100 nm.

8. A method for manufacturing a flash, wherein the flash comprises a plurality of memory cells, and steps of forming the memory cells comprise:
   step 1: providing a semiconductor substrate and forming a first shallow trench in a surface area of the semiconductor substrate in a forming area of a channel region;
   step 2: forming a hard mask layer, the hard mask layer fully filling the first shallow trench and covering a surface of the semiconductor substrate outside of the first shallow trench;
   step 3: using a photolithography process to define a formation area of a second shallow trench, and the hard mask layer and the semiconductor substrate are sequentially etched to form the second shallow trench according to a photolithographic definition;
   step 4: filling a shallow trench field oxide into the second shallow trench, and performing flattening to enable a surface of the shallow trench field oxide to be in flush with a surface of the hard mask layer, the shallow trench field oxide defining an active region;
   step 5: removing the hard mask layer in a self-aligned manner by using the shallow trench field oxide as a mask, and sequentially forming a tunneling dielectric layer and a polysilicon floating gate in a removed area of the hard mask layer, two side surfaces in a width direction of the polysilicon floating gate and two side surfaces in the width direction of the active region being self-aligned, a top surface of the polysilicon floating gate is a flat surface and higher than a top surface of the first shallow trench;
   step 6: etching back the shallow trench field oxide in a self-aligned manner by using the polysilicon floating gate as a mask, and etching back the surface of the shallow trench field oxide to be in flush with a surface of the semiconductor substrate;
   step 7: forming a control dielectric layer, the control dielectric layer covering a top surface and side surfaces of the polysilicon floating gate;
   step 8: forming a polysilicon control gate on a surface of the control dielectric layer;
   step 9: using a photolithography process to define a formation area of a gate structure, and sequentially etching the polysilicon control gate, the control dielectric layer, and the polysilicon floating gate according to the photolithographic definition to form the gate structure, the side surfaces of the polysilicon floating gate formed by etching being the two side surfaces in a length direction; the gate structure being formed by superposing a corresponding tunneling dielectric layer, the polysilicon floating gate, the control dielectric layer, and the polysilicon control gate; and
   step 10: forming a source region and a drain region in a self-aligned manner in active regions on two sides in the length direction of the polysilicon floating gate of the gate structure,
   wherein the channel region is located in a surface area of the semiconductor substrate covered by the polysilicon floating gate between the source region and the drain region, a surface of the channel region covered by the polysilicon floating gate is used to form a channel connecting the source region and the drain region, the channel is provided with a longitudinal structure extending along aside surface of the first shallow trench, the channel also includes a transverse structure located on a bottom surface of the first shallow trench and the surface of the semiconductor substrate outside of the first shallow trench and the longitudinal structure of the channel enables a length of the channel to be increased and enables the length of the polysilicon floating gate to be decreased under a condition that the length of the channel satisfies a short channel effect, thus reducing an area of the memory cell.

9. The method for manufacturing the flash according to claim 8, wherein the semiconductor substrate is a silicon substrate.

10. The method for manufacturing the flash according to claim 9, wherein the tunneling dielectric layer is an oxide layer and the control dielectric layer is a superposed layer of an oxide layer, a nitride layer, and an oxide layer.

11. The method for manufacturing the flash according to claim 10, wherein the memory cells are arranged in rows and columns to form an array structure of the flash, and the flash is in an NOR structure;
   polysilicon control gates of the memory cells in a same row are connected together to form a polysilicon row; the polysilicon row is defined through the photolithography process in step 9;
   drain regions of each of the memory cells in a same column are connected to a bit line composed of a front metal layer through corresponding contact holes;
   source regions, drain regions, and channel regions of the memory cells in the same column are located in active regions of a same column structure, and an overlapping area of the active region and a corresponding polysilicon row is the forming area of the polysilicon floating gate; and the active regions in each column are isolated by the shallow trench field oxide.

12. The method for manufacturing the flash according to claim 11, wherein the length of the polysilicon floating gate is less than two feature sizes, wherein the feature size is a size representing a technical node.

13. The method for manufacturing the flash according to claim 12, wherein the area of the memory cell is less than $6F^2$ and F represents one feature size.

14. The method for manufacturing the flash according to claim 13, wherein the feature size is less than 45 nm and the length of the channel satisfying the short channel effect is more than 100 nm.

15. The method for manufacturing the flash according to claim 9, wherein the hard mask layer is a nitride layer or the hard mask layer is a superposed layer of an oxide layer and a nitride layer.

* * * * *